(12) United States Patent
Birau et al.

(10) Patent No.: US 7,345,303 B2
(45) Date of Patent: Mar. 18, 2008

(54) ORGANIC THIN-FILM TRANSISTORS

(75) Inventors: Mihaela Maria Birau, Mississauga (CA); Yiliang Wu, Mississauga (CA); Beng S. Ong, Mississauga (CA)

(73) Assignee: Xerox Corporation, Norwalk, CT (US)

( * ) Notice: Subject to any disclaimer, the term of this patent is extended or adjusted under 35 U.S.C. 154(b) by 0 days.

(21) Appl. No.: 11/315,044

(22) Filed: Dec. 22, 2005

(65) Prior Publication Data

US 2007/0145354 A1 Jun. 28, 2007

(51) Int. Cl.
*H01L 51/00* (2006.01)

(52) U.S. Cl. .......... 257/40; 257/642; 257/759; 257/E21.024; 257/E21.492

(58) Field of Classification Search ............ None
See application file for complete search history.

(56) References Cited

U.S. PATENT DOCUMENTS

| | | | | |
|---|---|---|---|---|
| 4,547,444 A | * | 10/1985 | Bell et al. ............ | 430/11 |
| 4,704,470 A | * | 11/1987 | Johnson ............... | 560/137 |
| 5,568,417 A | * | 10/1996 | Furuki et al. ......... | 365/106 |
| 5,851,423 A | * | 12/1998 | Teng et al. ........... | 252/299.1 |
| 6,506,438 B2 | * | 1/2003 | Duthaler et al. ...... | 427/58 |
| 6,621,099 B2 | | 9/2003 | Ong et al. | |
| 6,770,904 B2 | | 8/2004 | Ong et al. | |
| 6,774,393 B2 | | 8/2004 | Murti et al. | |
| 2001/0007666 A1 | * | 7/2001 | Hoffman et al. ...... | 424/400 |
| 2001/0026915 A1 | * | 10/2001 | Charych et al. ...... | 435/5 |
| 2002/0155484 A1 | * | 10/2002 | Reed et al. ........... | 435/6 |
| 2003/0160234 A1 | | 8/2003 | Ong et al. | |
| 2003/0235768 A1 | * | 12/2003 | Fincher et al. ....... | 430/7 |
| 2004/0038075 A1 | * | 2/2004 | Wang et al. .......... | 428/690 |
| 2006/0139724 A1 | * | 6/2006 | Liang et al. .......... | 359/265 |

* cited by examiner

*Primary Examiner*—Thomas Dickey
*Assistant Examiner*—Scott R. Wilson
(74) *Attorney, Agent, or Firm*—Eugene O. Palazzo; Fay Sharpe LLP

(57) ABSTRACT

A novel barrier layer which protects electronic devices from adverse environmental effects such as exposure to light, especially white light, is described. The barrier layer comprises a copolymer having an acrylate unit and an acrylate unit with a pendant dye group. Also disclosed are processes for producing such electronic devices.

17 Claims, 2 Drawing Sheets

ORGANIC THIN-FILM TRANSISTORS

This development was made with United States Government support under Cooperative Agreement No. 70NANBOH3033 awarded by the National Institute of Standards and Technology (NIST). The United States Government has certain rights in the development.

BACKGROUND

The present disclosure relates, in various embodiments, to protective barrier layer compositions for the protection of organic electronic devices from adverse environmental effects such as exposure to light, especially white light, and other factors.

Thin film transistors ("TFT"s) are fundamental building blocks of electronic circuits. Structurally, TFT comprises a supporting substrate, three electrically conductive electrodes (gate, source and drain electrodes), a semiconductor layer, and a dielectric layer. For operational stability and extended life, it is often necessary to protect the TFTs from adverse environmental effects with a protective barrier layer. Various TFT configurations are possible to enable proper functioning of TFTs in electronic applications. The semiconductor is electrically insulating when the transistor is in its switched-off state, when no bias voltage is applied to the gate electrode. When a bias voltage is applied to the gate electrode, the transistor is switched on, an electric current flows between the source and the drain electrodes through the semiconductor layer. At a given source-drain electric field, the current flowing between the source-drain electrodes can be modulated by the bias voltage applied to the gate electrode.

Exposure to various environmental conditions can adversely affect the performance of an electronic device such as organic TFT ("OTFT"). For example, the organic semiconductor layer can be damaged by light, oxygen and moisture, etc. degrading its electrical properties. Consequently, in many applications TFTs need to be protected from the environmental conditions such as with a protective barrier or encapsulation layer. For inorganic material-based TFTs such as amorphous silicon TFTs, this is traditionally done by passivation with a vacuum deposited inorganic oxide layer (e.g., silicon nitrides). For low-cost OTFTs, a liquid-processable barrier layer would be preferable to lower manufacturing cost.

Conventional OTFT barrier or encapsulation layers consist of polymers like polyvinylphenol, polymethylmethacrylate (PMMA), polyethylene, polyethylene-terephthalate, and mixtures of these polymers. However, these polymers have high oxygen and water permeability and generally cannot function as satisfactory barrier layers for OTFTs. In addition, these polymers do not protect against white light-induced photodegradation. Furthermore, multilayer barrier layers are more costly to apply to OTFTs than a single barrier layer and are therefore less preferred. Hence, a need exists for alternative means for protecting electronic devices from environment conditions.

BRIEF DESCRIPTION

The present disclosure is directed, in various embodiments, to a class of novel barrier or encapsulation layers which can protect organic electronic devices, such as OTFTs, from the degradative effects of white light. The barrier layer of the present disclosure comprises a polymer having a dye group. In one specific embodiment, the barrier layer comprises a polymer having a pendent dye group. In more specific embodiment, the barrier layer comprises a copolymer of a monomer unit and a monomer unit having a pendant dye group. In one specific embodiment, the copolymer consists of an acrylate unit and an acrylate unit having a pendant dye group. In further specific embodiments, the pendant dye group is an azo dye.

These and other non-limiting characteristics of the embodiments of the present disclosure are more particularly described below.

DESCRIPTION OF THE DRAWINGS

Illustrated in FIGS. 1 to 4 are various representative embodiments of the present disclosure and wherein at least one layer functions as a barrier layer, and wherein polythiophenes may be selected as the channel materials in thin film transistor (TFT) configurations.

DETAILED DESCRIPTION

Figure 1:
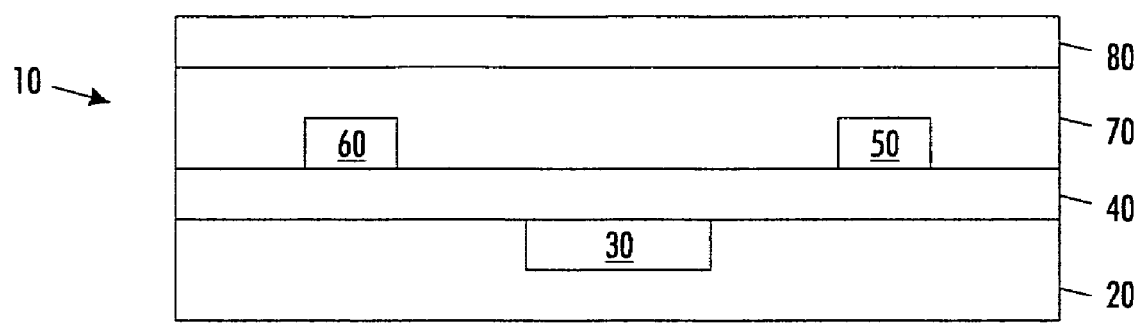

The present disclosure provides a novel class of barrier layers which are suitable for application in electronic devices, such as OTFTs. The barrier layer is meant to protect the electronic devices from exposure to ambient light, especially white light, as well as against other environmental constituents such as water and oxygen. Also disclosed herein are processes for producing such electronic devices.

A more complete understanding of the components, processes, and devices disclosed herein can be obtained by reference to the accompanying figures. These figures are merely schematic representations based on convenience and the ease of demonstrating the present development and are, therefore, not intended to indicate relative size and dimensions of the devices or components thereof and/or to define or limit the scope of the exemplary embodiments.

Although specific terms are used in the following description for the sake of clarity, these terms are intended to refer only to the particular structure of the embodiments selected for illustration in the drawings and are not intended to define or limit the scope of the disclosure. In the drawings and the following description below, it is to be understood that like numeric designations refer to components of like function.

An OTFT comprises three electrodes (a gate, a source and a drain electrode), a dielectric layer, a semiconductor layer, a substrate and a barrier layer which may also be referred to as an encapsulation layer.

FIG. 1 illustrates a first OTFT configuration. The OTFT 10 comprises a substrate 20 in contact with the gate electrode 30 and a dielectric layer 40. Although here the gate electrode 30 is depicted within the substrate 20, this is not required; the key is that the dielectric layer 40 separates the gate electrode 30 from the source electrode 50, drain electrode 60, and the semiconductor layer 70. The source electrode 50 contacts the semiconductor layer 70. The drain electrode 60 also contacts the semiconductor layer 70. The semiconductor layer 70 runs over and between the source and drain electrodes 50 and 60. The barrier layer 80 is over and in contact with the semiconductor layer 70.

Figure 2:
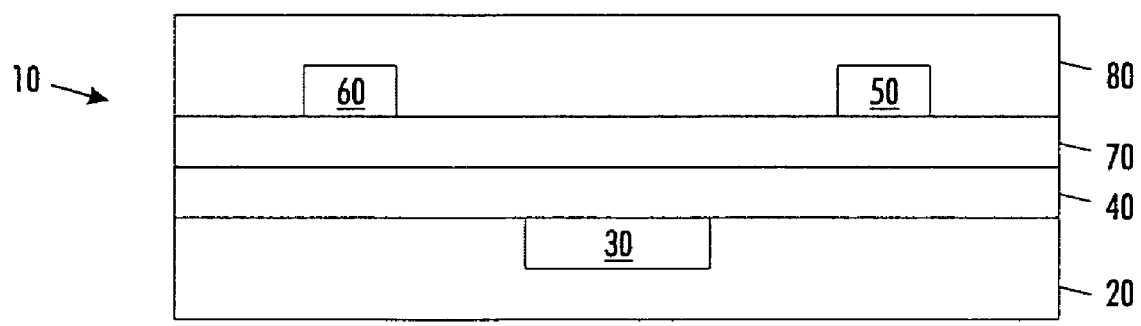

FIG. 2 illustrates a second OTFT configuration. The OTFT 10 comprises a substrate 20 in contact with the gate electrode 30 and a dielectric layer 40. The semiconductor layer 70 is placed on top of the dielectric layer 40 and separates it from the source and drain electrodes 50 and 60. The barrier layer 80 is over and in contact with the source and drain electrodes 50 and 60 as well as the semiconductor layer 70.

Figure 3:
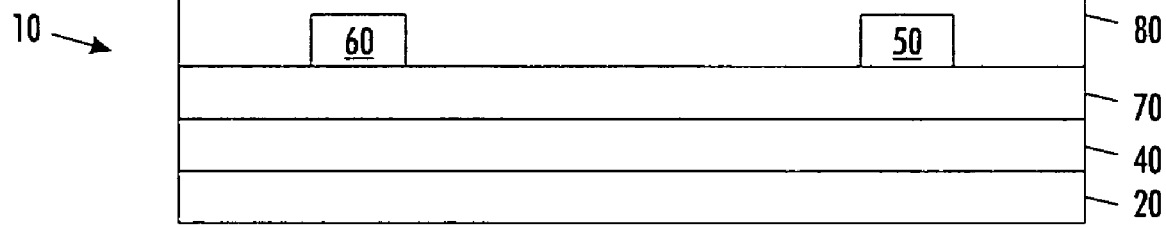

FIG. 3 illustrates a third OTFT configuration. The OTFT 10 comprises a substrate 20 which also acts as the gate electrode and is in contact with a dielectric layer 40. The semiconductor layer 70 is placed on top of the dielectric layer 40 and separates it from the source and drain electrodes 50 and 60. The barrier layer 80 is over and in contact with the source and drain electrodes 50 and 60 as well as the semiconductor layer 70.

Figure 4:
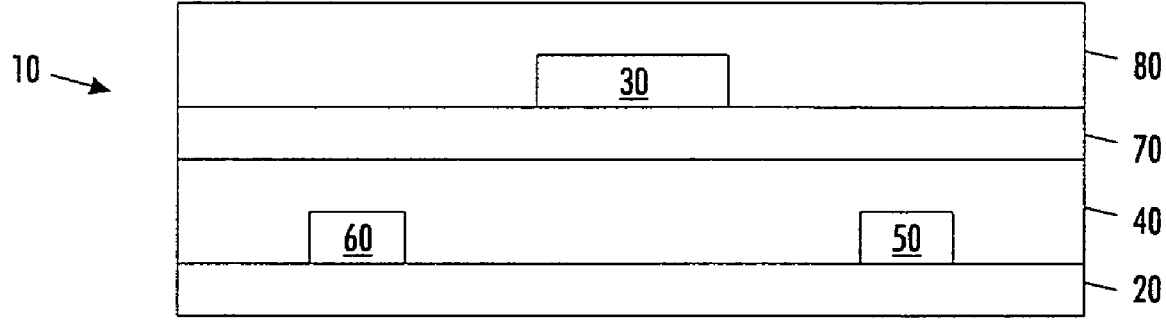

FIG. 4 illustrates a fourth OTFT configuration. The OTFT 100 comprises a substrate 20 in contact with the source electrode 50, drain electrode 60, and the semiconductor layer 70. The semiconductor layer 70 runs over and between the source and drain electrodes 50 and 60. The dielectric layer 40 is on top of the semiconductor layer 70. The gate electrode 30 is on top of the dielectric layer 40 and does not contact the semiconductor layer 70. The barrier layer 80 is over and in contact with the gate electrode 30 as well as the semiconductor layer 70.

Also, other devices not disclosed, especially TFT devices, are envisioned, reference for example known TFT devices.

The barrier layer of the present disclosure is applied as a single layer to the organic electronic device, such as an OTFT. The barrier layer generally has a thickness of from about 50 nm to about 50 microns. In further embodiments, it has a thickness of from about 100 nanometers to about 10 microns.

The barrier layer of the present disclosure comprises a polymer which has a dye group. The polymer could be a homopolymer or copolymer including random, alternative and block copolymer. In embodiments, the polymer can be polyacrylate, polymethacrylate, polyester, polycarbonate, polyimide, polyurethane, polyvinyl, and the like. The dye group incorporated in the polymer can be a pendant group to the polymer backbone, a part of the polymer backbone, or both. The copolymer comprises two or more co-monomers, at least one of which has a dye group attached to it.

In embodiments, the polymer is a copolymer. Exemplary polymer comprising the dye groups are illustrated below. The component units are called monomers for illustrative purposes.

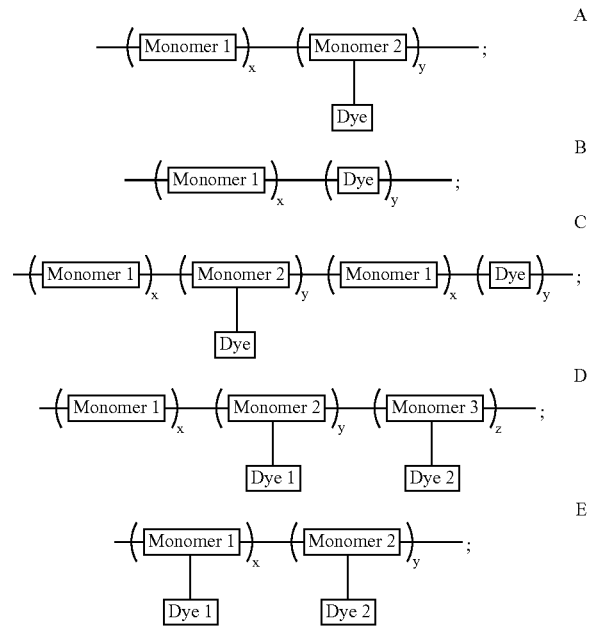

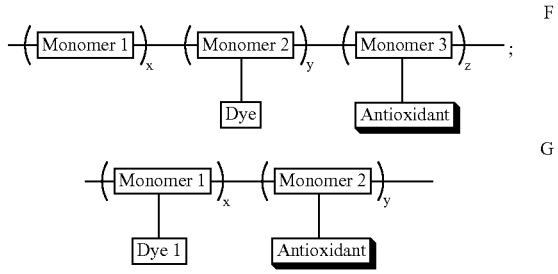

The copolymer can be a polymer having the dye-containing repeat unit and a repeat unit without a dye group, for example structure (A) and (B). The copolymer can also be a polymer having two repeat units which containing different dye groups, for example structure (D). The copolymer can be a combination of above two cases such as structures (C) and (D).

The dye group can be any dye that has UV-Vis absorbance from about 350 to about 800 nm, selected according to the Sigma-Aldrich Handbook of Stains, Dyes and Indicators. The purpose of the dye is to mask the UV-Vis absorbance of the semiconducting polymer. More than one dye can be used as long as the UV-Vis absorbance covers the 350-800 nm range as specified above (D and E above), including from about 400 nm to about 600 nm. Examples of suitable dyes include, but are not limited to acetate dye group, azo-dye group and quinone dye group. In a specific embodiment, the pendant dye group is an azo-dye. In a specific embodiment, the dye is an azo-dye group, 2-[4-(2-chloro-4-nitrophenylazo)-N-ethylphenylamino]ethanol. 2-[4-(2-Chloro-4-nitrophenylazo)-N-ethylphenylamino]ethanol has the following chemical structure as shown in Formula (B):

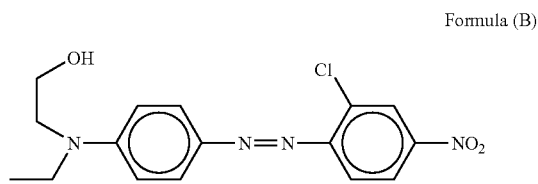

Formula (B)

While not wanting to be limited to any particular theory, it is believed that the pendant dye group absorbs incident light, thus protecting the semiconductor layer of the OTFT from light exposure.

The barrier layer usually comprises from about 5 to about 99 weight percent of the polymer based on the total weight of the barrier layer. In further embodiments, the barrier layer comprises from about 20 to about 95 weight percent of the polymer based on the total weight of the barrier layer.

In one specific embodiment, the copolymer comprises a methyl methacrylate repeating unit and a methyl methacrylate repeating unit having a pendant azo-dye group as shown below in Formula (I) below:

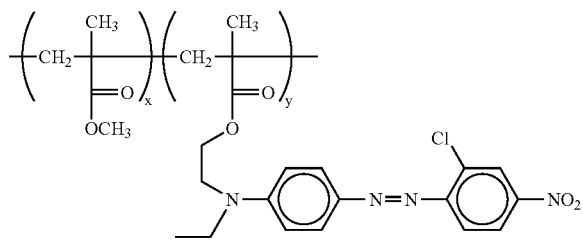

Formula (I)

wherein x and y are the molar ratio of their respective co-monomer. This Formula (I) is intended only to show the structure of the co-monomers and their molar ratios and should not be construed as more.

If desired, the copolymer may contain more than one co-monomer having a pendant dye group. For example, the copolymer could comprise a first co-monomer with a first pendant dye group, and a second co-monomer with a second pendant dye group. Each pendant dye group could absorb incident light of different wavelengths. The copolymer may also contain more than two co-monomers without a pendant dye group.

The first co-monomer (regular unit) may be present in a molar ratio of from about 5 to about 95 percent by mole. The second co-monomer (containing the pendant dye group) may be present in a molar ratio of from about 95 to about 5 percent by mole. The ratio is based on the total moles of the first and second co-monomers. In other words, the sum of x and y is about 1. Any additional co-monomers are considered a first co-monomer if it does not have a pendant dye group and a second co-monomer if it does.

The barrier layer may further comprise an antioxidant. An antioxidant can be dispersed in the polymer or attached as a pendant group in the comonomer (see Formulas E and F above). The comonomer with a pendant antioxidant group can be an acrylate monomer with a pendant unit such as triazole, substituted triazole, benzophenone, substituted benzophenone, triazine, substituted triazine or a phosphite. If presented as a dispersant, the antioxidant can be from about 0.5 percent to about 10 percent by weight of the total barrier layer. If presented as a group in the copolymer, the repeat unit comprising the antioxidant can be about 0.5 percent to about 10 percent by mole of the copolymer.

Any antioxidant which acts as an oxygen scavenger and is compatible with the copolymer may be used. An antioxidant should disperse easily in the copolymer and not disrupt the smoothness of the film surface through crystallization. Antioxidants which may be used include, but are not limited to, derivatives of benzophenone, substituted benzophenones, triazine, substituted triazines, benzotriazol, substituted benzotriazoles, phosphites, and mixture thereof. Substituted benzophenones include but are not limited to 2-hydroxy-4-octyloxybenzophenone, 2',4'-dihydroxy-3'-propylacetophenone, 2-hydroxy-4-methoxybenzophenone. The antioxidant usually comprises from about 0.1 to about 10 weight percent of the barrier layer based on the total weight of the barrier layer. In further embodiments, the antioxidant comprises from about 0.1 to about 5 weight percent of the barrier layer based on the total weight of the barrier layer. More than one antioxidant may be used if desired An inorganic particulate material may also be used in the barrier layer. Any inorganic material which is a "high-density material" may be used. A high-density material is a material with atomic spacing sufficiently close such that diffusion of outside species like water is hindered. High-density materials include inorganic materials such as metal oxides. Specific metal oxides are silicon oxides ($SiO_x$) including silicon monoxide (SiO) and silicon dioxide ($SiO_2$), silicon oxinitrides, aluminum oxides, and mixtures thereof. Inorganic oxides also act as a moisture barrier.

The inorganic particulate material may also be surface modified to be compatible with the copolymer. This is generally done, but not limiting to, by coating the particles with a silane coupling agent of formula $R—Si(X)_nY_{3-n}$ wherein R and X each other represent an alkyl group from about 1 to 60 carbon atoms, a substituted alkyl group from about 1 to 60 carbon atoms, or a substituted aryl group from about 6 to 60 carbon atoms. An alkyl or substituted alkyl group can be selected from a group consisting of methyl, ethyl, propyl, butyl, pentyl, hexyl, heptyl, octyl, nonyl, decyl, undecyl, dodecyl, tridecyl, tetradecyl, pentadecyl, hexadecyl, heptadecyl, octadecyl, chloromethyl, methoxyethyl, methoxypropyl, methoxybutyl, methylbutyl, methylpentyl, fluoromethyl, phenylmethyl, benzyl, phenylethyl, perfluoroalkyl such as difluoroethyl, trifluoroethyl, trifluoropropyl, and tridecafluoro-1,1,2,2,-tetrahydrooctyl, while an aryl group can be selected from a group consisting of phenyl, tolyl, xylyl, chlorophenyl, dichlorophenyl, methoxyphenyl, cyanophenyl, ethylphenyl, ethoxyphenyl, propylphenyl, biphenyl, and perfluorophenyl, and the like. Y represents an active group that enables the attachment of the silane molecule on the metal oxide. That can be a halogen atom for example chlorine atom, a hydroxyl atom, and an alkoxy group. n represents an integer of 0, 1, and 2. Preferred silane coupling reagents are selected from, but not limited to, a group consisting of methyltrimethoxisilane, methyltriclorosilane, ethyltrimethoxysilane, ethyltrichlorosilane, methyltriethoxysilane, propyltrimethoxysilane, propyltriclorosilane, phenyltrimethoxysilane, phenyltriclorosilane, phenylethyltrimethoxysilane, phenylethyltrioclorosilane, octyltrimethoxysilane, octyltrichlorosilane, tolyltrimethoxysilane, tolyltrichlorosilane, benzyltrimethoxysilane, benzyltrichlorosilane, diphenyldimethoxysilane, diphenyldichlorosilane, diphenyldisilanol, and mixtures of thereof. In further embodiments the silane reagents are selected from a group consisting of phenyltrimethoxysilane, phenylethyltrimethoxysilane, benzyltrimethoxysilane, and p-tolyltrimethoxysilane. In a further embodiment phenylethyltrimethoxysilane is used.

The inorganic particulate material is usually from about 0.5 to about 50 weight percent of the barrier layer based on the total weight of the barrier layer. In further embodiments, it comprises from about 0.5 to about 10 weight percent of the barrier layer based on the total weight of the barrier layer. More than one inorganic particulate material may be used if desired.

Barrier layer components, including the polymer of the present disclosure, are easily processed into a solution or dispersion in a liquid by dissolving or dispersing them in organic solvents such as toluene, hexane, heptane, ethyl acetate, acetone. The solution or dispersion can then be applied to an OTFT using any liquid deposition methods known in the art. Such methods include, but are not limited to, spin coating, dip coating, casting, and printing.

Substrate

The substrate may be opaque or substantially transparent. It can comprise any suitable organic or inorganic material having the requisite mechanical properties. It may be composed of for instance silicon wafer, glass plate, plastic film or sheet. For structurally flexible devices, a plastic substrate, such as for example polyester, polycarbonate, polyimide sheets and the like may be preferred. The thickness of the substrate may be from about 10 micrometers to over about 10 millimeters with an exemplary thickness being from about 50 to about 100 micrometers, especially for a flexible plastic substrate and from about 1 to about 10 millimeters for a rigid substrate such as glass plate or silicon wafer.

Electrodes

The gate electrode can be a thin metal film, a conducting polymer film, a conducting film made from conducting ink or paste, or the substrate itself can be the gate electrode, for example heavily doped silicon. Examples of gate electrode materials include but are not restricted to aluminum, gold, chromium, indium tin oxide, conducting polymers such as polystyrene sulfonate-doped poly(3,4-ethylenedioxythiophene) (PSS-PEDOT, from Aldrich), conducting ink/paste comprised of carbon black/graphite or colloidal silver dispersion in polymer binders, such as ELECTRODAG™ available from Acheson Colloids Company. The gate electrode can be prepared by vacuum evaporation, sputtering of metals or conductive metal oxides, coating from conducting polymer solutions or conducting inks by spin coating, casting or printing. The thickness of the gate electrode ranges for example from about 10 to about 200 nanometers for metal films and in the range of about 1 to about 10 micrometers for polymer conductors.

The source and drain electrodes can be fabricated from materials which provide a low resistance ohmic contact to the semiconductor. Typical materials suitable for use as source and drain electrodes include those of the gate electrode materials such as gold, nickel, aluminum, platinum, conducting polymers and conducting inks. Typical thicknesses of source and drain electrodes are about, for example, from about 40 nanometers to about 10 micrometers with the more specific thickness being about 100 to about 400 nanometers.

Semiconductor

Materials suitable for use as the organic semiconductor include acenes, such as anthracene, tetracene, pentacene, and substituted pentacenes, perylenes, fullerenes, phthalocyanines, oligothiophenes, polythiophenes, and substituted derivatives thereof. In embodiments, the organic semiconductor layer is formed from a liquid processable material. Examples of suitable semiconductor materials include polythiophenes, oligothiophenes, and the semiconductor polymers described in U.S. application Ser. No. 10/042,342, which is published as U.S. patent application Ser. No. 2003/0160234, and U.S. Pat. Nos. 6,621,099, 6,774,393, and 6,770,904, the disclosures of which are incorporated herein by reference in their entireties. Additionally, suitable materials include the semiconductor polymers disclosed in "Organic Thin Film Transistors for Large Area Electronics" by C. D. Dimitrakopoulos and P. R. L. Malenfant, Adv. Mater., Vol. 12, No. 2, pp. 99-117 (2002), the disclosure of which is also incorporated herein by reference.

The semiconductor layer may be formed by any suitable means including but not limited to vacuum evaporation, spin coating, solution casting, dip coating, stencil/screen printing, flexography, gravure, offset printing, inkjet-printing, micro-contact printing, a combination of these processes, and the like. In embodiments, the semiconductor layer is formed by a liquid deposition method. In embodiments, the semiconductor layer has a thickness of from about 10 nanometers to about 1 micrometer. In further embodiments, the organic semiconductor layer has a thickness of from about 30 to about 150 nanometers. In other embodiments, the semiconductor layer has a thickness of from about 40 to about 100 nanometers.

Gate Dielectric

The dielectric layer which separates the gate electrode from the source and drain electrodes, and is in contact with the semiconductor layer, can generally be an inorganic material film, an organic polymer film, or an organic-inorganic composite film. The thickness of the dielectric layer is, for example, from about 10 nanometers to about 1 micrometer with a more specific thickness being about 100 nanometers to about 500 nanometers. Illustrative examples of inorganic materials suitable as the dielectric layer include silicon oxide, silicon nitride, aluminum oxide, barium titanate, barium zirconate titanate, and the like; illustrative examples of organic polymers for the dielectric layer include polyesters, polycarbonates, poly(vinyl phenol), polyimides, polystyrene, poly(methacrylate)s, poly(acrylate)s, epoxy resin, and the like; and illustrative examples of inorganic-organic composite materials include nanosized metal oxide particles dispersed in polymers such as polyester, polyimide, epoxy resin and the like. The insulating dielectric layer is generally of a thickness of from about 50 nanometers to about 500 nanometers depending on the dielectric constant of the dielectric material used. More specifically, the dielectric material has a dielectric constant of, for example, at least about 3, thus a suitable dielectric thickness of about 300 nanometers can provide a desirable capacitance, for example, of about $10^{-9}$ to about $10^{-7}$ F/cm$^2$.

The following examples illustrate OTFTs according to the present disclosure. The examples are merely illustrative and are not intended to limit the present disclosure with regard to the materials, conditions, or process parameters set forth therein.

EXAMPLE

Synthesis of the Co-Monomer with the Pendant Dye Group

The synthesis of the co-monomer having a pendant dye group is described with reference to Formula (II) below:

Formula (II)

(A)

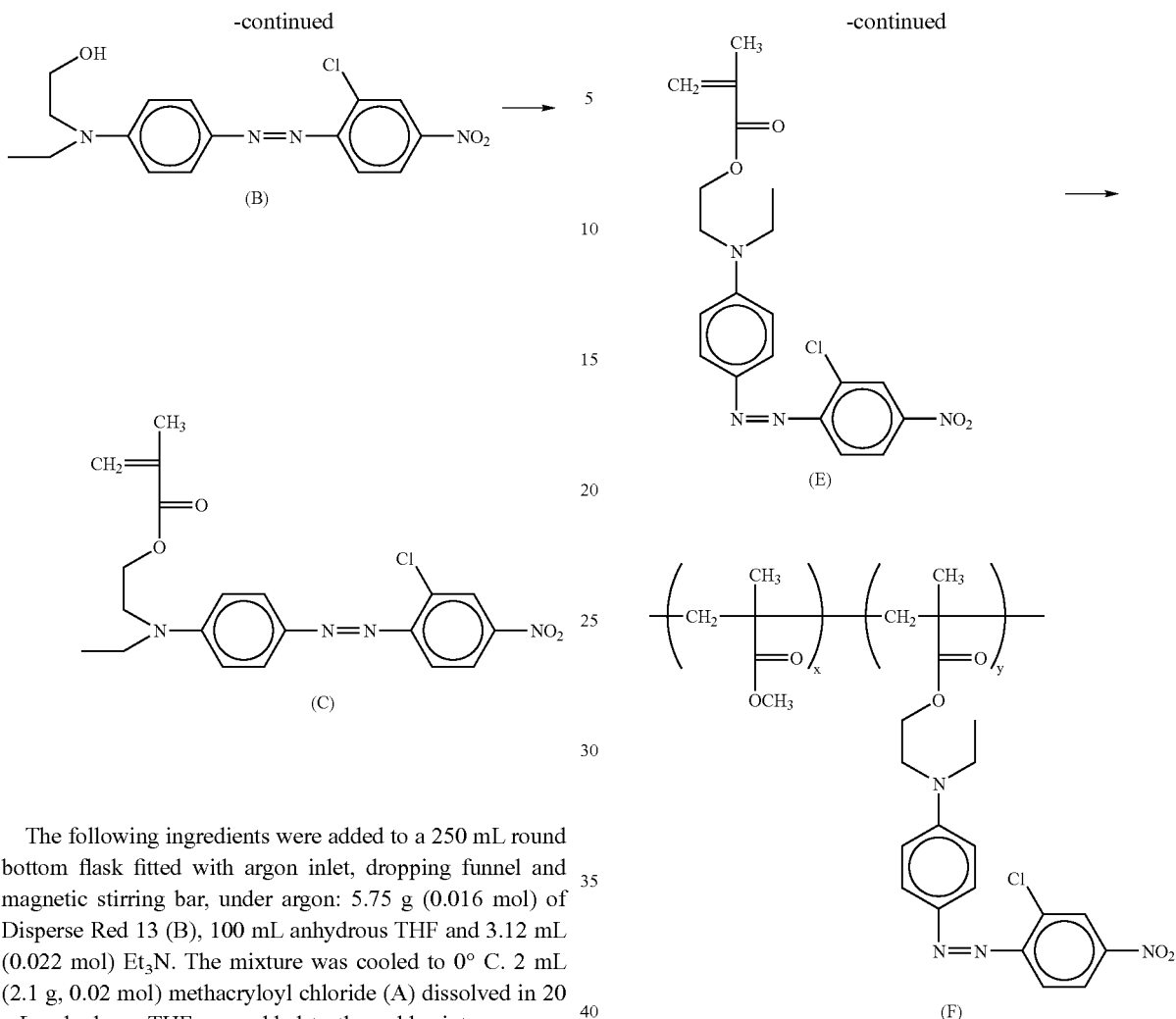

The following ingredients were added to a 250 mL round bottom flask fitted with argon inlet, dropping funnel and magnetic stirring bar, under argon: 5.75 g (0.016 mol) of Disperse Red 13 (B), 100 mL anhydrous THF and 3.12 mL (0.022 mol) Et$_3$N. The mixture was cooled to 0° C. 2 mL (2.1 g, 0.02 mol) methacryloyl chloride (A) dissolved in 20 mL anhydrous THF was added to the cold mixture over a period of 2 hours via a dropping funnel. The reaction mixture was allowed to stir overnight. The solution was taken in CH$_2$Cl$_2$ and washed with 5% aq. HCl and saturated NaCl solution. The red residue was chromographed on a silica gel column using CH$_2$Cl$_2$ as a solvent (4.1 g red solid, 50%). Recrystallization out of methanol yielded 3.46 g (80% recovery) red crystals (C).

Copolymerization

The copolymerization was a free radical polymerization as described with reference to Formula (III) below:

Formula (III)

The following ingredients were added to a 100 mL round bottom flask fitted with argon inlet, reflux condenser and magnetic stirring bar, under argon: 2.7 mL (2.5 g, 0.025 mol) methyl methacrylate (D), 2.08 g (0.005 mol) co-monomer (E), 0.041 g (0.00025 mol) azobisisobutyronitrile (AIBN) as free radical initiator and 20 mL anhydrous DMF. The temperature was raised to 60° C. and the reaction was allowed to proceed for 72 hours. The solution was poured over methanol with stirring. The red solid was filtered and dried in vacuum overnight. 3.93 g (86%) of a crude red polymer was obtained. After purification through reverse precipitation and drying in vacuum 3.2 g (81%) of the pure polymer was obtained (Mw=57796, Mn=24845, PD=2.3).

Comparison

Bottom-contact TFTs were fabricated in the following manner. The TFTs were comprised of an n-silicon wafer with a thermally grown silicon oxide layer having a thickness of 110 nanometers. The wafer functioned as the gate electrode while the silicon layer while the silicone oxide functioned as the dielectric layer and had a capacitance of about 30 nanofarads per square centimeter (nF/cm2) as measured with a capacitor meter. The silicon wafer was first cleaned with isopropanol, air dried, and then immersed in a 0.1M solution of octyltrichlorosilane in toluene for 20 minutes at 60° C. The wafer was subsequently washed with toluene and isopropanol and dried. A 30 nanometers thin film of PTQ-12 semiconductor layer, reference the publication by B. S. Ong, et al., Journal of the American Chemical Society, volume 126, pages 3378-3379 (2004) was deposited by spin coating, dried in a vacuum oven, and then heated at 140° C. for 10-30 minutes. An array of gold source-drain electrode pairs with a film with a film thickness of about 60 nanometers and various channel lengths and widths was subsequently deposited on top of the semiconductor by vacuum evaporation of gold through a shadow mask.

Control devices used a barrier layer consisting of commercially available poly(methyl methacrylate) (PMMA). Example devices used a barrier layer consisting of the copolymer of the present disclosure. The OTFTs were exposed to white light under ambient conditions for 30 days. The TFTs were evaluated measuring their output transfer curves using a Keithley 4200 Semiconductor characterization system immediately after encapsulation and over a period of 30 days after storage in ambient air and white light.

Comparative Example 1

The control devices were encapsulated using a 7 weight percent solution of commercially available poly(methyl methacrylate) in ethyl acetate. The encapsulation layer was prepared by dissolving 0.631 g of PMMA in 9.3 mL ethyl acetate and was deposited by spin coating on top of the TFT. The TFTs were dried at 60° C. for about 1 to 3 hours. The thickness of the encapsulation layer was about 680 nm. The control devices exhibited only partial protection against exposure to white light under ambient conditions. Significant losses in on/off ratio and in charge carrier mobility were observed. After 30 days the mobility showed a decrease by 25%, while the on/off ratio decreased by 50%.

Comparative Example 2

The TFTs were encapsulated using a 7 weight percent solution of copolymer containing pendant dye in ethyl acetate. The encapsulation layer was prepared by dissolving 0.631 g of copolymer in 9.3 mL ethyl acetate. The encapsulation layer was deposited on top of the transistor by spin coating and the TFTs were dried at about 60° C. for 1 to 3 hours. The example devices protected by the barrier layer consisting of the copolymer of the present disclosure retained its characteristics very well. After 30 days the mobility decreased only by 10% and the on/off ratio remained the same.

The results show conclusively that the copolymer barrier layer provided much better protection against exposure to degradative environmental conditions than a barrier layer of PMMA.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is:

1. An electronic device comprising an organic semiconductor layer and a barrier layer, wherein the barrier layer comprises a polymer, wherein the polymer comprises a first monomer having a dye group, the first monomer having the formula

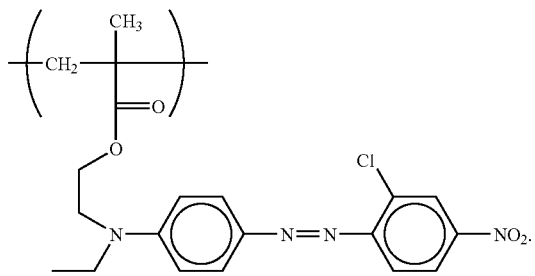

2. The electronic device according to claim 1, wherein the absorbance of the dye group is similar or broader than the absorbance of the semiconductor in visible region.

3. The electronic device according to claim 1, wherein the barrier layer further comprises an antioxidant.

4. The electronic device according to claim 3, wherein the antioxidant is a pendant group of the polymer.

5. The electronic device of claim 1, where the dye absorbs from about 350 to about 800 nm.

6. The electronic device according to claim 1, wherein the polymer has a formula (I)

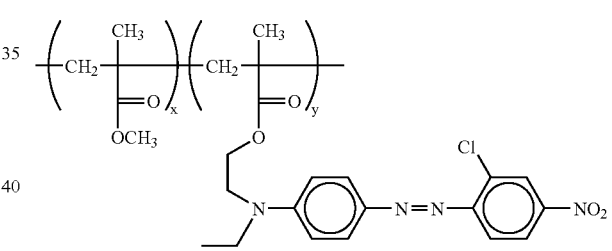

(I)

wherein x and y are the molar ratio of their respective co-monomer, wherein the sum of x and y is about 1.

7. The electronic device of claim 1, wherein the barrier layer further comprises an inorganic particulate material.

8. The electronic device of claim 1, wherein the polymer comprises from about 5 to about 99 weight percent of the barrier layer based on the total weight of the barrier layer.

9. The electronic device of claim 1, wherein the polymer further comprises a second monomer.

10. The electronic device of claim 9, wherein the second monomer has a second pendant dye group.

11. The electronic device of claim 9, wherein the second monomer does not have a pendant dye group.

12. The electronic device of claim 1, wherein the the barrier layer has a thickness of from about 50 nanometers to about 50 microns.

13. A thin film transistor comprising an organic semiconductor layer and a barrier layer, wherein the barrier layer comprises a polymer, wherein the polymer comprises a first monomer having a dye group, the first monomer having the formula

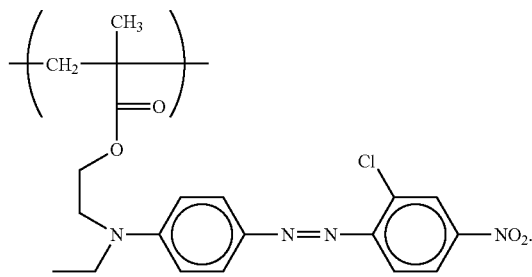

14. The thin film transistor according to claim 13, wherein the absorbance of the dye group is similar or broader than the absorbance of the semiconductor in visible region.

15. The thin film transistor according to claim 13, wherein the semiconductor is selected from the group consisting of oligothiophene, polythiophene and pentacene.

16. The electronic device of claim 13, wherein the the barrier layer has a thickness of from about 50 nanometers to about 50 microns.

17. A thin film transistor comprising a layer comprising a polymer of formula (I)

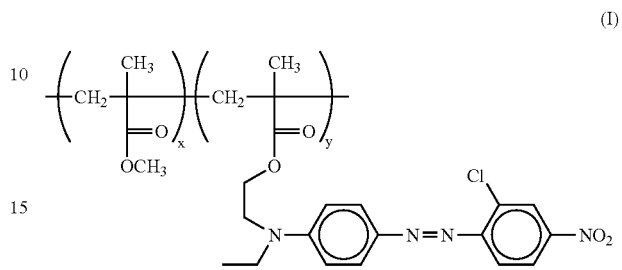

wherein x and y are the molar ratio of their respective co-monomer, wherein the sum of x and y is about 1.

* * * * *

UNITED STATES PATENT AND TRADEMARK OFFICE
CERTIFICATE OF CORRECTION

PATENT NO. : 7,345,303 B2
APPLICATION NO. : 11/315044
DATED : March 18, 2008
INVENTOR(S) : Maria Birau Page 1 of 1

It is certified that error appears in the above-identified patent and that said Letters Patent is hereby corrected as shown below:

In the Specification
Column 1, lines 4 and 5, after "Cooperative Agreement No.", please delete "70NANBOH3033" and insert --70NANB0H3033--.

Signed and Sealed this
Fourteenth Day of January, 2014

Michelle K. Lee
*Deputy Director of the United States Patent and Trademark Office*